(12) United States Patent
Ignjatovic et al.

(10) Patent No.: US 8,174,424 B2
(45) Date of Patent: *May 8, 2012

(54) IMAGE SENSING SYSTEM

(75) Inventors: Zeljko Ignjatovic, Rochester, NY (US); Mark F. Bocko, Caledonia, NY (US)

(73) Assignee: ADVIS, Inc., Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/977,506

(22) Filed: Dec. 23, 2010

(65) Prior Publication Data

US 2011/0095923 A1   Apr. 28, 2011

Related U.S. Application Data

(63) Continuation of application No. 12/372,270, filed on Feb. 17, 2009, now Pat. No. 7,876,249.

(51) Int. Cl.
*H03M 1/34* (2006.01)
*H03M 1/00* (2006.01)

(52) U.S. Cl. ......... 341/164; 341/137; 341/155; 341/158
(58) Field of Classification Search .......... 341/137, 341/155, 158, 164; 348/308; 356/625
See application file for complete search history.

(56) References Cited

U.S. PATENT DOCUMENTS

| 4,173,788 A | 11/1979 | Laliotis |
| 5,880,459 A * | 3/1999 | Pryor et al. ............... 250/208.1 |
| 2007/0176108 A1 | 8/2007 | Such et al. |
| 2007/0216790 A1 | 9/2007 | Kok |

* cited by examiner

*Primary Examiner* — Jean B Jeanglaude
(74) *Attorney, Agent, or Firm* — Fish & Richardson P.C.

(57) ABSTRACT

In general, a method includes comparing a first input signal with a second input signal to produce an output signal. The first input signal corresponds to an amount of light detected by a sensor, and the second input signal corresponds to an aggregated value of the output signal. The method may also include aggregating the output signal in a digital accumulator and converting a digital signal from an output of the digital accumulator to an analog signal.

28 Claims, 7 Drawing Sheets

IMAGE SENSING SYSTEM

CROSS-REFERENCE TO RELATED APPLICATIONS

This application is a continuation of and claims priority to U.S. patent application Ser. No. 12/372,270, filed Feb. 17, 2009 now U.S. Pat. No. 7,876,249, the contents of which are incorporated herein by reference.

TECHNICAL FIELD

This patent application relates to an image sensing system.

BACKGROUND

Complementary metal-oxide-semiconductor (CMOS) image sensor readout circuit designs have been developed in recent years. Most designs employ analog circuits, such as passive and active pixel sensors (APS). Subsequently, digital pixel image sensor designs were developed, which included approaches incorporating an oversampling sigma delta ($\Sigma\Delta$) analog-to-digital converter at the pixel level and approaches that employ a Nyquist rate analog-to-digital converter at the pixel level. Digital pixel designs have several potential advantages over APS designs, including higher dynamic range and linearity, lower fixed pattern noise (FPN), and lower power consumption. The $\Sigma\Delta$ based image sensor designs have been demonstrated to have higher dynamic range than the APS and Nyquist rate digital image sensor designs.

SUMMARY

In general, in some aspects, an image sensing system includes a photosensitive element electrically connected to a first input of a comparator, and a feedback loop electrically connected between an output of the comparator and a second input of the comparator.

Some aspects may include one or more of the following features. The feedback loop includes a digital accumulator to receive the output of the comparator, and a digital-to-analog converter electrically connected between the digital accumulator and the second input of the comparator. A dither signal generator adds an analog dither signal to an output of the digital-to-analog converter. A dither signal generator adds a digital dither signal to an output of the digital accumulator. The image sensing system includes a multiplexer having a first input, a second input, and an output, the first input being electrically connected to the output of the comparator, the second input being electrically connected to the output of a dither signal generator, and the output being electrically connected to the input of the digital accumulator. A decimation filter is electrically connected to the output of the comparator. The output of the decimation filter corresponds to an amount of light detected by the photosensitive element over an integration period. The photosensitive element includes two or more photosensitive elements. The image sensing system includes a multiplexer, wherein each of the two or more photosensitive elements is electrically connected to two or more corresponding inputs of the multiplexer, and an output of the multiplexer being electrically connected to the first input of the comparator. The comparator includes a single bit comparator or a multibit comparator. The digital accumulator is set to a predetermined value to provide an initial threshold to the comparator.

In general, in some aspects, a method includes comparing a first input signal with a second input signal to produce an output signal, the first input signal corresponding to an amount of light detected by a sensor, and the second input signal corresponding to an aggregated value of the output signal.

Some aspects may include one or more of the following features. The output signal is aggregated in a digital accumulator and a digital signal from an output of the digital accumulator is converted to an analog signal. An analog dither signal is added to the second signal. A digital dither signal is added to the second signal. The output signal is multiplexed with a dither signal. The output signal is communicated through a decimation filter to generate a second output signal representing an amount of light detected by the sensor over an integration period. The sensor includes two or more sensors that provide a multiplexed input to a comparator. The first input signal and the second input signal are compared in either a single bit comparator or a multibit comparator. The first input signal is compared with a predetermined threshold, the predetermined threshold being adjustable based on the second input signal.

DESCRIPTION OF THE DRAWINGS

Like reference numbers indicate like elements.

DETAILED DESCRIPTION

Early generations of CMOS silicon image devices were based on passive pixel sensors (PPS) with analog readout. While those passive sensors suffered from poor signal quality due to the direct transmission of the pixel voltage (integrated charges) on capacitive column busses, CCD based sensors were still preferred for their quality image sensing. With the second generation of image sensors, quality was improved with active pixel sensors (APS), where a buffer transistor (follower) was included in the pixel circuit to prevent destructive readout. The signal read from each pixel was either a current or a voltage. With further increases in circuit speed driven by technology down scaling and reduced supply voltages, precision requirements for pixel analog circuitry became difficult to meet. With reduced feature sizes, more transistors per pixel can be added to the point where a significant part of the pixel circuit is entirely digital. In fact, trends of image sensing are moving towards digital pixel sensors (DPS) that offer numerous advantages such as simplicity, scalability, on-chip processing, low power consumption, wide dynamic range and lower cost.

$\Sigma\Delta$ digital pixel image sensors exhibit high dynamic range due to both oversampling, which avoids pixel saturation, and to the noise-shaping performance of a $\Sigma\Delta$ modulator. Noise shaping refers to shift of the output noise of the $\Sigma\Delta$ modulator to high frequencies, which subsequently is attenuated by a low-pass decimation filter applied to the modulator output. An extended dynamic range of the image sensor falls mostly at high illumination levels; however, good low-light performance has not been demonstrated in conventional $\Sigma\Delta$ digital pixel designs. Within this context, low-light performance refers to the image sensor's ability to detect light below a predefined level. The reason for this relatively poor low-light performance is that, under low illumination, the digital output of the ΣΔ modulator contains mostly digital 0's and very few digital 1's. Because averaging is applied to a small number of random quantities (digital 1's), the resultant variance is large and poor noise statistics result. Thus, modulator noise sources, such as pixel reset noise, comparator input transistor flicker noise, and quantization noise, are not efficiently noise shaped and, therefore, are little attenuated by the decimation filter employed at the output of the ΣΔ modulator. In other words, noise adversely affects the output of the system despite the presence of decimation filters and the like.

Figure 1:
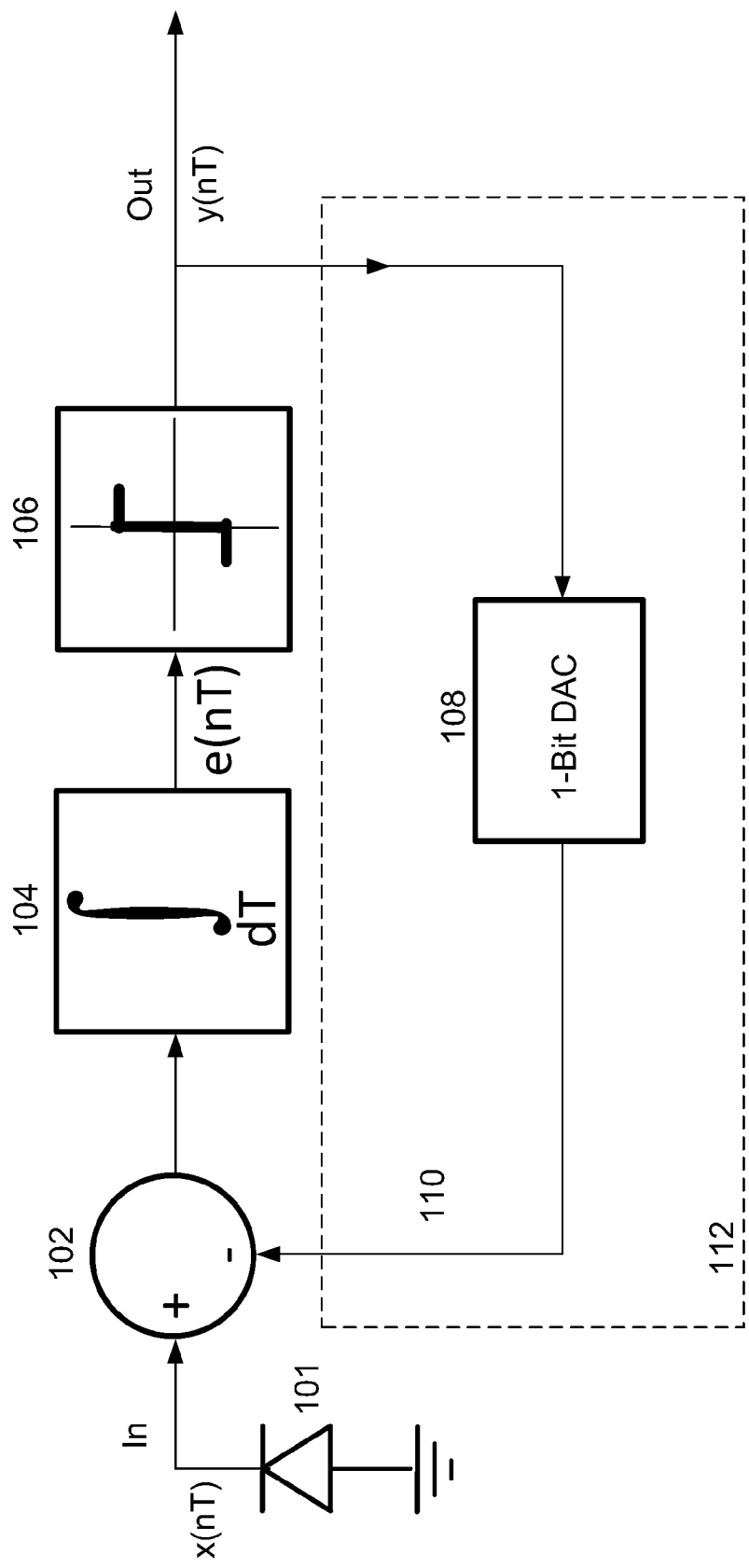
FIG. 1 is an example of a conventional first order $\Sigma\Delta$ modulator.

FIG. 1 is an example of a conventional first order ΣΔ modulator. The ΣΔ modulator receives an input signal x(nT) (e.g., an illumination signal) and produces an output signal y(nT), where T is the sampling period and n is the sample number. The ΣΔ modulator contains a summation node 102, an analog integrator 104, a 1-bit quantizer ("comparator") 106 and 1-bit feedback digital-to-analog converter (DAC) 108. During the conversion, the comparator adds quantization noise, represented as e(nT), to the integrated signal.

One possible solution to the low-light problem faced by conventional ΣΔ modulators (such as that shown in FIG. 1) is to vary the threshold of comparator 106 according to the function given by Equation 1 (below). The comparator threshold voltage $V_{thresh}$ is a linear function of time:

$$V_{thresh}(t) = \Delta V \frac{t}{t_{exp}} + V_{init} \quad (1)$$

and $V_{init}$, $\Delta V$, and $t_{exp}$ represent the initial comparator threshold value, the maximum threshold voltage change during light exposure, and light exposure time, respectively.

Ramping the threshold value of the comparator, as given by Equation (1) above, is equivalent to having a constant light-intensity at a photodiode, which is used to detect light and to generate the integrated signal x(nT) as shown in FIG. 1. The resulting equivalent photo-generated current $I_{bias}$ is given by the following Equation 2:

$$I_{bias} = \frac{C_{sen} \Delta V}{t_{exp}} \quad (2)$$

in which $C_{sen}$ is the total capacitance at the sensing node (e.g., the output of the detector). With this externally generated biasing signal ($I_{bias}$), which may be generated by external analog or mixed analog and digital circuitry, applied to the input of the ΣΔ modulator, the feedback will be utilized with greater frequency, which effectively increases the noise shaping of the ΣΔ modulator output and in turn improves the effective SNR at low light intensity levels. However, the DAC output, which is employed each time the comparator outputs a digital 1, has a switching noise component so, each time the feedback is applied, a random amount of charge is injected into the photodiode. The total noise power injected by the DAC increases in proportion to the number of times the DAC feedback is applied. On the other hand, quantization noise is reduced as the modulator outputs more digital 1's. Therefore, there is a point at which the DAC switching noise and modulator quantization noise contribute to the overall noise in equal amounts. If the DAC noise can be reduced, this will lead to a lower overall noise level. A full noise assessment also accounts for the comparator input transistor flicker noise and the photodiode reset noise; however, the DAC noise is the primary factor. Designing a precise feedback DAC is challenging because the DAC capacitance values must be made smaller as pixel size is reduced, which helps with the DAC switching noise; however, the unpredictable effects of parasitic capacitances, transistor leakage, and clock feed-through may increase as a result.

Figure 2:
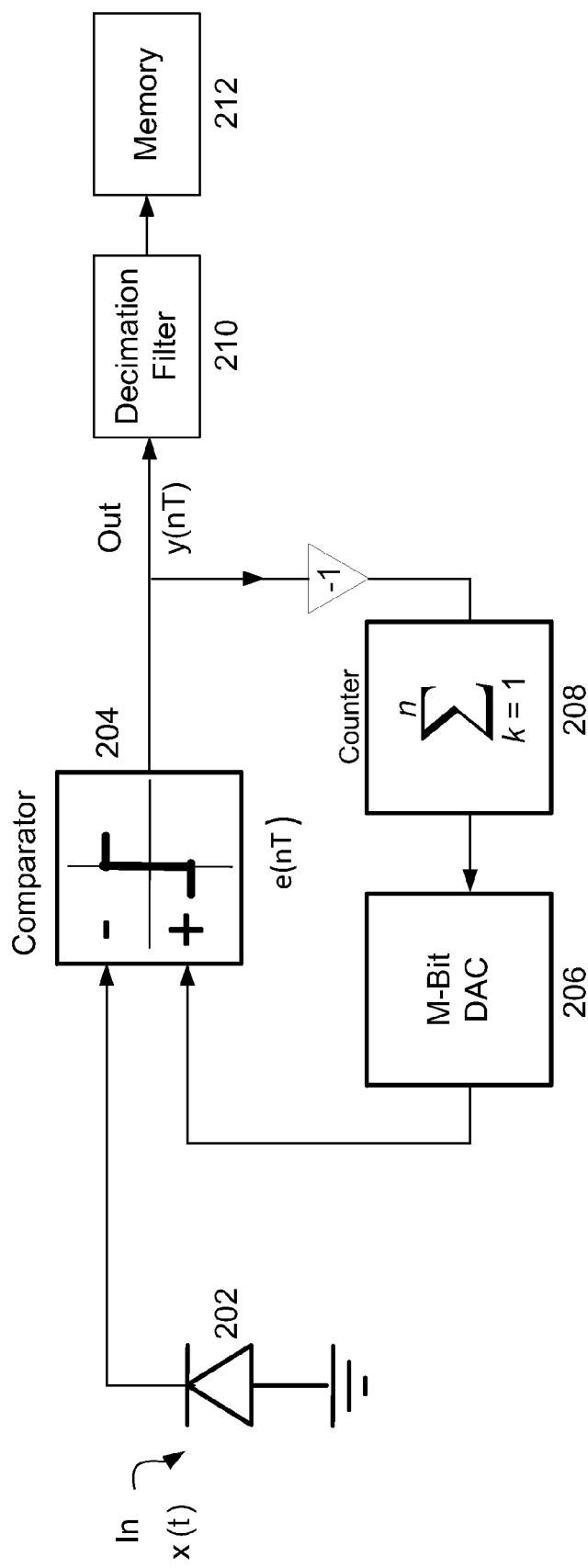
FIG. 2 is an example of a first order $\Sigma\Delta$ modulator with indirect feedback.

The present disclosure describes alternative ΣΔ readout architectures that decouple the feedback loop 112 (FIG. 1) from the photodiode. FIG. 2 is an exemplary first order ΣΔ modulator with indirect feedback in combination with a photodiode 202. While the examples of FIGS. 1 and 2 include a photodiode (such as photodiode 202) as a photosensitive element, other light sensitive elements could be used such as a photogate. In image sensing applications where a photodiode is used in the photovoltaic mode to sense the incident light intensity, the photodiode 202 accumulates photo-generated charge. Photo-generated charge results from the build-up of charge produced when light is applied to the photodiode. Thus, with the light intensity as the input signal, the photodiode 202 serves as an analog integrator in the forward path of the system.

In the architecture shown in FIG. 2, the photodiode 202 is isolated from the feedback M-bit DAC 206. Consequently, leakage charge (including transistor leakage and clock feed-through) that is present in the DAC will not be injected into the photodiode. In addition, since the M-bit feedback DAC is inside the loop of the ΣΔ modulator, its switching noise and non-linear distortion can be noise-shaped to high frequencies and thus have a reduced effect on the input signal x(t).

For example, as photodiode 202 accumulates charge from a light source (not shown), voltage is passed to a first input (−) of comparator 204. Once a value is received at the first input (−) of comparator 204 (in this case, a value representing the total integrated charge detected by the photodiode 202), a comparison operation is performed between the value at the first input (−) and the value at the second input (+). As shown in the example of FIG. 2, the value at the second input (+) of comparator 204 is approximately equal to the value of the output of DAC 206; that is, the threshold of comparator 204 is defined by the output of DAC 206. In this way, the threshold of comparator 204 can be a variable threshold.

In some examples, the threshold value of the comparator 204 can have a predefined initial value, such as a value that approximates the middle of the average operating range of the system (e.g, $0.5V_{DD}$, where $0.5V_{DD}$ is the power supply voltage). This threshold may be defined by setting the counter 208 at a non-zero value. As a result of setting a non-zero value in counter 208, DAC 206 will output a non-zero analog signal to comparator 204 upon start-up of the system.

After photodiode 202 transmits a value corresponding to the amount of light it detected, a comparison is performed at the comparator 204. For instance (assuming counter 208 contains a value greater than zero, as described above), in a first cycle, the output of photodiode 202 may be greater than the predefined initial threshold of the comparator 204, the threshold being equal to the value stored in the counter 208. As a result, the comparator 204 outputs a digital '0,' which is collected at the input of counter 208. That is, the counter subtracts a value of "0" from its accumulated value. With the counter 208 being updated with a digital 0, the DAC 206 outputs the same value that was generated on the previous cycle (in this case, the start-up value). Accordingly, no adjustment to the preset comparator threshold is made during this cycle. This ΣΔ modulator will remain in this state until enough charge accumulates at photodiode 202 such that the photodiode voltage falls below the threshold (the output of DAC 206).

Once the photodiode 202 collects an amount of charge such that its voltage falls below the threshold of the comparator, the comparator will output a digital "1." This value is captured by the feedback loop electrically connected to the output of the comparator 204, and counter 208 decrements by one. The counter decrements by "1" because the output of comparator 204 is a digital "1." The counter 208 outputs its value to DAC 206, which converts the value received from counter 208 to an analog signal. The analog signal generated by DAC 206 is passed to the second input (+) of comparator 204. As a result, a new threshold level is set for comparator 204. This threshold level is lower than the threshold of the previous cycle, as it corresponds to an output value of the counter 206 that has been decremented by one.

After a number of cycles, the value of the threshold (i.e., the value stored in counter 208) may again fall below the value of the signal generated at photodiode 202. This is because the output of DAC 206 will correspond to the decreased value of counter 208. Once the state of the circuit has reached this point, the comparison operation will essentially repeat the process described above. That is, the comparator will continue to output digital 0s until photodiode 202 accumulates an amount of charge such that once again its voltage falls below the threshold value.

In some examples, the DAC 206 is configured to decrement the threshold at a rate that exceeds the rate at which photodiode 202 will accumulate charge. In some instances, for every digital 1 received from counter 208, DAC 206 may produce an amount of voltage that is ten times greater than the average rate at which photodiode 202 accumulates charge. Stated differently, if photodiode 202 accumulates charge at an average rate of −0.01V per clock cycle, DAC 206 may adjust the threshold by −0.1V. If those exemplary values are used, the comparator 204 may output a value of 1 once every ten clock cycles. These values and rates are purely illustrative, and the actual values and rates employed in the system are a matter of design choice.

In some examples, the output of the comparator 204 may be stored directly in memory 212, or the output may be filtered and stored. In the latter case, the output of comparator 204 is received by decimation filter 210. The decimation filter 210 takes the output from the comparator 204 and combines the 1's and 0's to provide a multibit output. In some examples, the decimation filter 210 can be an adder to simply count the number of 1s. However, instead of totaling all of the 1s and 0s, it may also be more desirable to provide a weighted sum of the single bits. In some examples, the decimation filter 210 is a low pass filter in which more weight is given to middle filter coefficients that represent multipliers for each bit. The decimation filter 210 stores the result and puts out a single multibit number at the end of a cycle. As a result, the output data rate of decimation filter is lower than the input data rate. Thus, the output of the decimation filter 210 is associated with the light intensity detected by the photodiode during the integration period. This result can be stored in a memory location such as memory 212. While other examples and figures discussed herein do not expressly include a decimation filter or a memory device such as those shown in FIG. 2, these elements could be added to any of the examples described herein.

Figure 3:
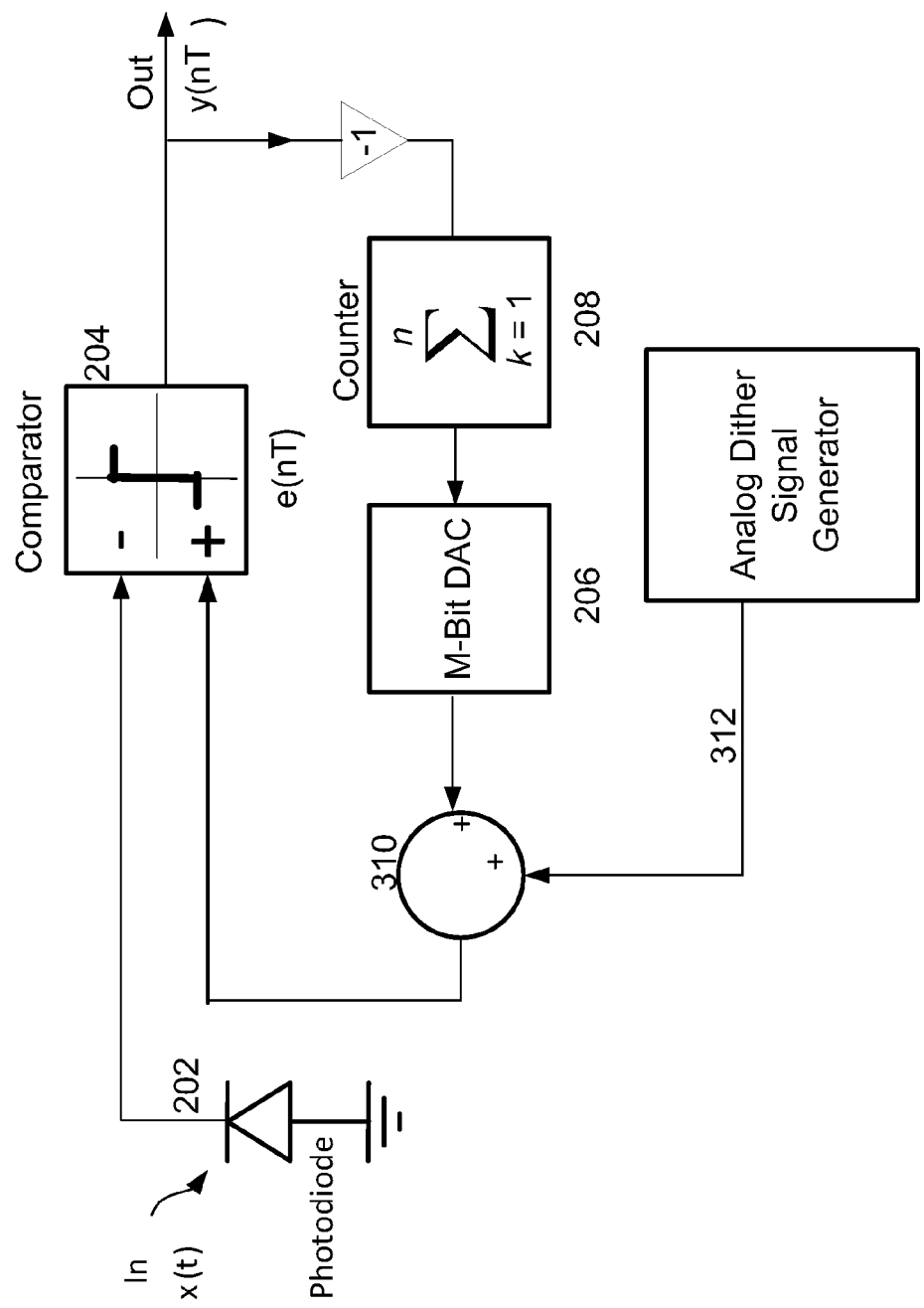
FIGS. 3-5 are examples of first order $\Sigma\Delta$ modulators with indirect feedback and various dither addition methods.

Because the precision of the ΣΔ pixel readout may not be affected by the precision of the feedback DAC 206, a dither signal may be applied to a signal before it is received at an input of the comparator 204 to ensure optimal biasing conditions and noise-shaping performance. Stated differently, adding dither to the input signal may help to ensure that the comparator outputs a significant number of digital 1's during an exposure frame. As shown in FIG. 3, an analog dither signal 312 may be applied to the entire imaging array as an analog signal added to the outputs of the multi-bit DACs for single pixels. The analog dither signal can be a ramp-like dither signal (e.g., a signal that is a linear function of time).

Figure 4:
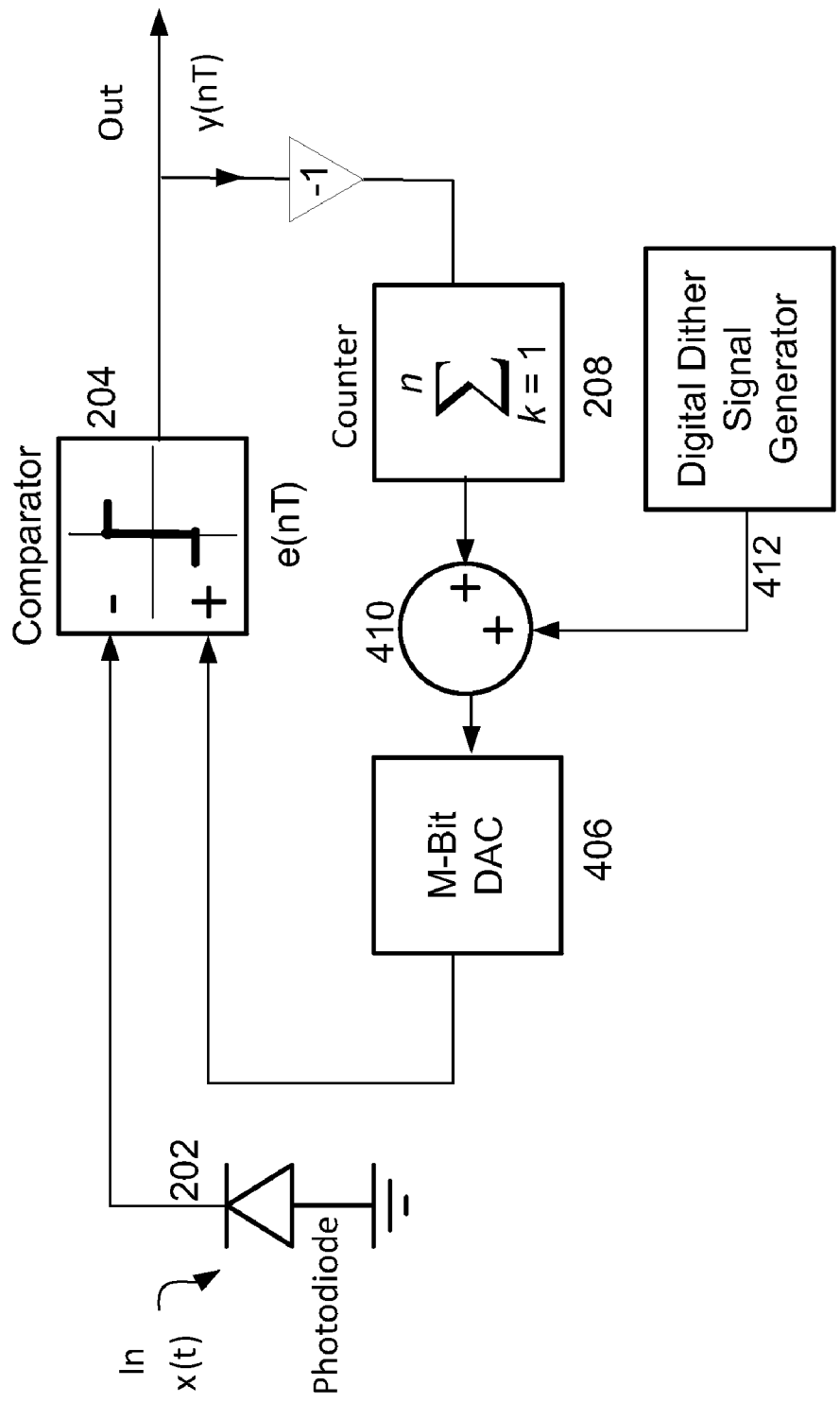

In the example of FIG. 4, a digital dither signal 412 may be generated and added to the input signal of the DAC 406. DAC 406 is effectively the same as DAC 206 (FIG. 2); however, they have been labeled differently due to its different location within the circuit. In both the analog and digital dither examples, the dither signal may be any desired linear or nonlinear function and it also may have a random component to reduce limit cycles (idle tones) common to low-order ΣΔ modulators.

Figure 5:
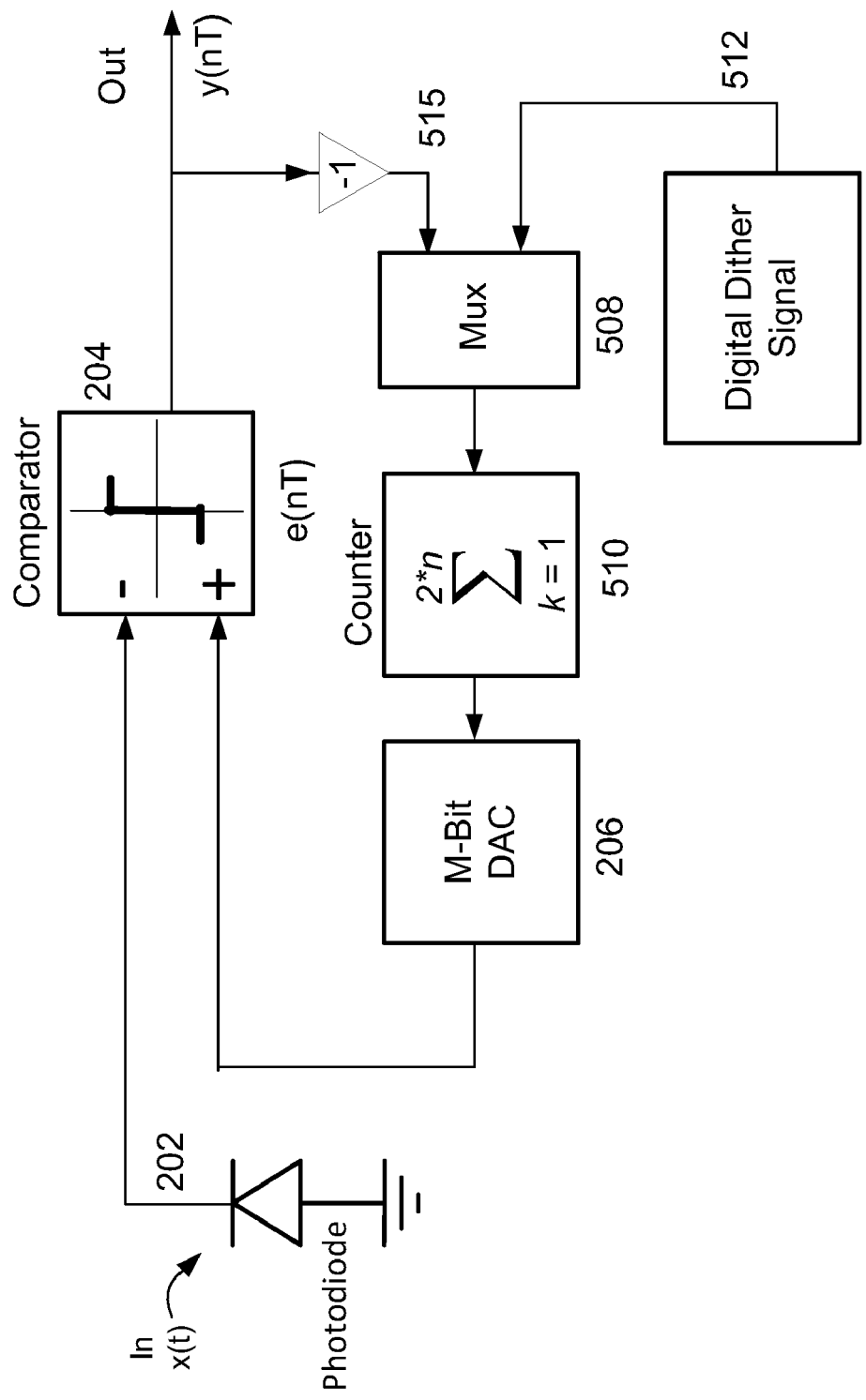

In the example of FIG. 5, a digital value 512 (referred to as a "dither signal" in FIG. 5) may be added to the counter in the feedback path to achieve ramp-like dithering operation. In this example, a string of single bit values is multiplexed with the comparator output 515 and the counter 510 is clocked at twice the over sampling ratio (e.g., 2*OSR). In all of the examples, adding dither at different points within the feedback loop helps to avoid generating a periodic signal (idle tones) at the output.

Figure 6:
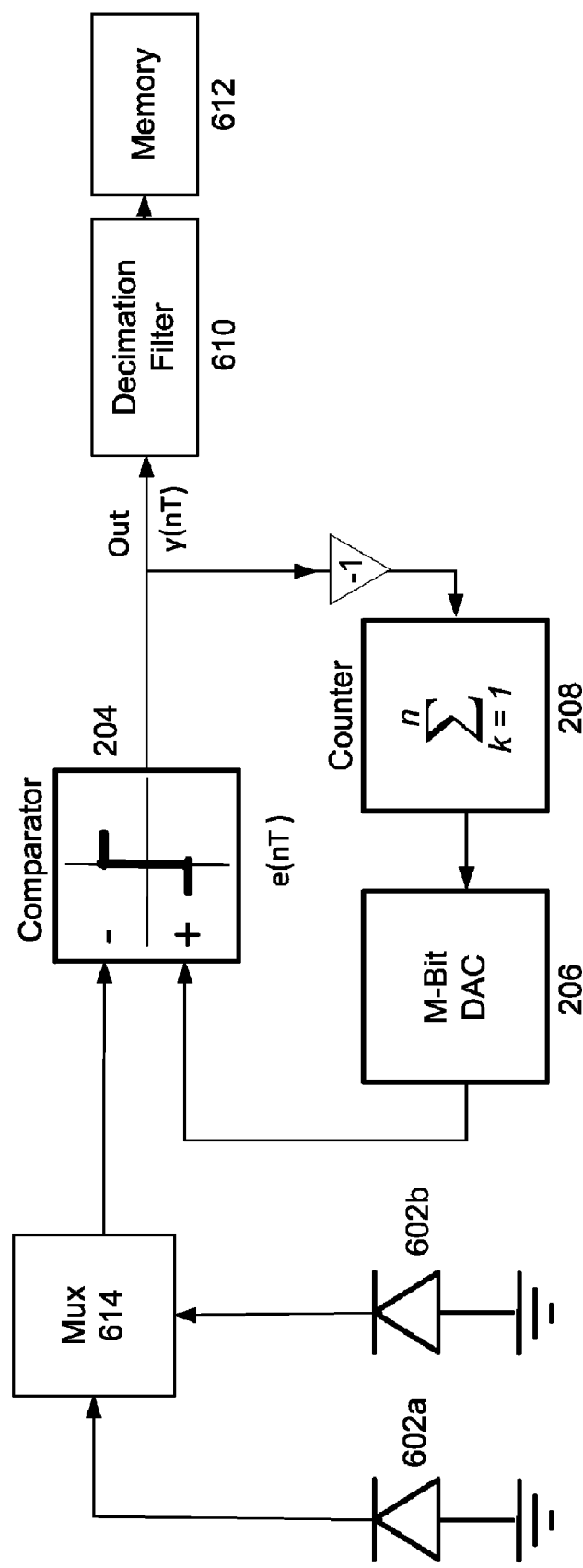
FIG. 6 is an example of a first order $\Sigma\Delta$ modulator with indirect feedback coupled to multiple photosensitive elements.

In some examples (such as the example shown in FIG. 6), more than one photosensitive element can be electrically connected to the input of the comparator 204. For simplicity, FIG. 6 illustrates an example containing two photodiodes, however, more than two photodiodes could be used. Photodiodes 602a and 602b provide inputs to multiplexer 614. Multiplexer 614 is electrically connected to the input of comparator 204. Comparator 204 operates in the same manner described in previous examples, and continues to output values that are passed through the counter 208 and DAC 206. Accordingly, the feedback loop may set the threshold of comparator 204 for both photodiodes 602a and 602b. Using the techniques described above with regard to FIG. 6, groups of pixels can share some of the other electrical components of the image sensing system. For example, rows, columns, pairs, and groups of neighboring or adjacent pixels may be multiplexed to provide an input to the comparator.

The above examples can incorporate multiple combinations of the dither insertion points described with regard to FIGS. 3-5, as such a determination is a matter of design choice. Similarly, in any of the examples described above, a multibit comparator may be used in place of a single bit comparator to provide a multibit output. As described in ΣΔ ADC theory, a multibit comparator reduces the quantization noise power at a given OSR, increasing the signal to noise ratio (SNR) and the dynamic range. Alternatively, it allows the ΣΔ ADC to achieve the same SNR and dynamic range at a lower value of OSR i.e., reduced operating speed.

The architectures described herein enable high fill factor for imaging array detectors (i.e., the fraction of the imager area devoted to the photosensitive elements). These architectures can also have little DC offset fixed pattern noise, and can have reduced reset and transistor readout noise in comparison to other imaging array readout techniques. These factors combine to lower readout noise and provide improved low light response and increased dynamic range. The ΣΔ pixel design also has comparatively low power consumption, small nonlinearity, and relative insensitivity to process variation.

Figure 7:
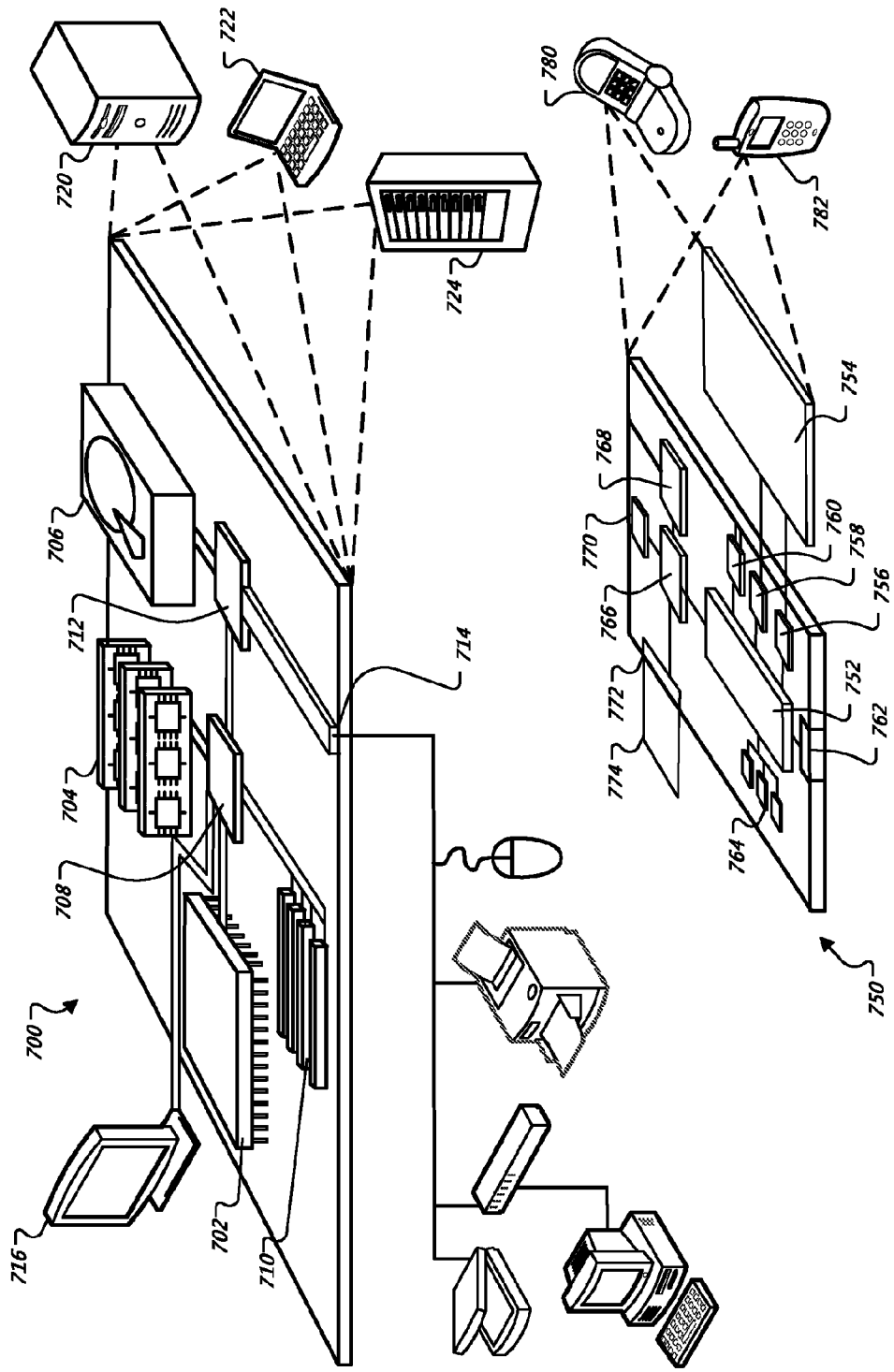
FIG. 7 is a block diagram of computing devices.

The ΣΔ modulator and the accompanying circuitry described in FIGS. 1-6 could be used in conjunction with the circuitry of FIG. 7. FIG. 7 is a block diagram of computing devices 700, 750 that may be used to implement the systems and methods described in this document, either as a client or as a server or plurality of servers. Computing device 700 is intended to represent various forms of digital computers, such as laptops, desktops, workstations, personal digital assistants, digital cameras, surveillance cameras, camera enabled mobile phones, surveillance cameras, servers, blade servers, mainframes, and other appropriate computers. Computing device 750 is intended to represent various forms of mobile devices, such as digital cameras, camera enabled mobile phones, surveillance cameras, personal digital assistants, cellular telephones, smartphones, and other similar computing devices. The components shown here, their connections and relationships, and their functions, are meant to be exemplary only, and are not meant to limit implementations of the inventions described and/or claimed in this document.

Computing device 700 includes a processor 702, memory 704, a storage device 706, a high-speed interface 708 connecting to memory 704 and high-speed expansion ports 710, and a low speed interface 712 connecting to low speed bus 714 and storage device 706. Each of the components 702, 704, 706, 708, 710, and 712, are interconnected using various busses, and may be mounted on a common motherboard or in other manners as appropriate. The processor 702 can process instructions for execution within the computing device 700, including instructions stored in the memory 704 or on the storage device 706 to display graphical information for a GUI on an external input/output device, such as display 716 coupled to high speed interface 708. In other implementations, multiple processors and/or multiple busses may be used, as appropriate, along with multiple memories and types of memory. Also, multiple computing devices 700 may be connected, with each device providing portions of the necessary operations (e.g., as a server bank, a group of blade servers, or a multi-processor system).

The memory 704 stores information within the computing device 700. In one implementation, the memory 704 is a computer-readable medium. In one implementation, the memory 704 is a volatile memory unit or units. In another implementation, the memory 704 is a non-volatile memory unit or units.

The storage device 706 is capable of providing mass storage for the computing device 700. In one implementation, the storage device 706 is a computer-readable medium. In various different implementations, the storage device 706 may be a floppy disk device, a hard disk device, an optical disk device, or a tape device, a flash memory or other similar solid state memory device, or an array of devices, including devices in a storage area network or other configurations. In one implementation, a computer program product is tangibly embodied in an information carrier. The computer program product contains instructions that, when executed, perform one or more methods, such as those described above. The information carrier is a computer- or machine-readable medium, such as the memory 704, the storage device 706, memory on processor 702, or a propagated signal.

The high speed controller 708 manages bandwidth-intensive operations for the computing device 700, while the low speed controller 712 manages lower bandwidth-intensive operations. Such allocation of duties is exemplary only. In one implementation, the high-speed controller 708 is coupled to memory 704, display 716 (e.g., through a graphics processor or accelerator), and to high-speed expansion ports 710, which may accept various expansion cards (not shown). In the implementation, low-speed controller 712 is coupled to storage device 706 and low-speed expansion port 714. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 700 may be implemented in a number of different forms, as shown in the figure. For example, it may be implemented as a standard server 720, or multiple times in a group of such servers. It may also be implemented as part of a rack server system 724. In addition, it may be implemented in a personal computer such as a laptop computer 722. Alternatively, components from computing device 700 may be combined with other components in a mobile device (not shown), such as device 750. Each of such devices may contain one or more of computing device 700, 750, and an entire system may be made up of multiple computing devices 700, 750 communicating with each other.

Computing device 750 includes a processor 752, memory 764, an input/output device such as a display 754, a communication interface 766, and a transceiver 768, among other components. The device 750 may also be provided with a storage device, such as a microdrive or other device, to provide additional storage. Each of the components 750, 752, 764, 754, 766, and 768, are interconnected using various busses, and several of the components may be mounted on a common motherboard or in other manners as appropriate.

The processor 752 can process instructions for execution within the computing device 750, including instructions stored in the memory 764. The processor may also include separate analog and digital processors. The processor may provide, for example, for coordination of the other components of the device 750, such as control of user interfaces, applications run by device 750, and wireless communication by device 750.

Processor 752 may communicate with a user through control interface 758 and display interface 756 coupled to a display 754. The display 754 may be, for example, a TFT LCD display or an OLED display, or other appropriate display technology. The display interface 756 may comprise appropriate circuitry for driving the display 754 to present graphical and other information to a user. The control interface 758 may receive commands from a user and convert them for submission to the processor 752. In addition, an external interface 762 may be provide in communication with processor 752, so as to enable near area communication of device 750 with other devices. External interface 762 may provide, for example, for wired communication (e.g., via a docking procedure) or for wireless communication (e.g., via Bluetooth or other such technologies).

The memory 764 stores information within the computing device 750. In one implementation, the memory 764 is a computer-readable medium. In one implementation, the memory 764 is a volatile memory unit or units. In another implementation, the memory 764 is a non-volatile memory unit or units. Expansion memory 774 may also be provided and connected to device 750 through expansion interface 772, which may include, for example, a SIMM card interface. Such expansion memory 774 may provide extra storage space for device 750, or may also store applications or other information for device 750. Specifically, expansion memory 774 may include instructions to carry out or supplement the processes described above, and may include secure information also. Thus, for example, expansion memory 774 may be provide as a security module for device 750, and may be programmed with instructions that permit secure use of device 750. In addition, secure applications may be provided via the SIMM cards, along with additional information, such as placing identifying information on the SIMM card in a non-hackable manner.

The memory may include for example, flash memory and/or MRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 764, expansion memory 774, memory on processor 752, or a propagated signal.

Device 750 may communicate wirelessly through communication interface 766, which may include digital signal processing circuitry where necessary. Communication interface 766 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 768. In addition, short-range communication may occur, such as using a Bluetooth, WiFi, or other such transceiver (not shown). In addition, GPS receiver module 770 may provide additional wireless data to device 750, which may be used as appropriate by applications running on device 750.

Device 750 may also communicate audibly using audio codec 760, which may receive spoken information from a user and convert it to usable digital information. Audio codex 760 may likewise generate audible sound for a user, such as through a speaker, e.g., in a handset of device 750. Such sound may include sound from voice telephone calls, may include recorded sound (e.g., voice messages, music files, etc.) and may also include sound generated by applications operating on device 750.

The computing device 750 may be implemented in a number of different forms, as shown in the figure. For example, it may be implemented as a cellular telephone 780. It may also be implemented as part of a smartphone 782, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

The connections shown in FIGS. 1-7 represent electrical connectivity and the elements do not necessarily directly connect (although they may appear to be from the figures). It is noted that electrical connection, when used herein, does not require a direct physical connection. An electrical connection may include intervening components between two components. Likewise, electrical connection may include non-wired electrical connections, such as those produced by a transformer.

A number of implementations have been described. Nevertheless, it will be understood that various modifications may be made without departing from the spirit and scope. For example, advantageous results may be achieved if the steps of the disclosed techniques were performed in a different sequence, if components in the disclosed systems were combined in a different manner, or if the components were replaced or supplemented by other components. Any and all aspects of FIGS. 1-6 may be combined to form implementations not specifically described herein. The functions and processes (including algorithms) may be performed in hardware, software, or a combination thereof, and some implementations may be performed on modules or hardware not identical to those described. Accordingly, other implementations are within the scope of the following claims.

What is claimed is:

1. An image sensing system comprising:
    a photosensitive element electrically connected to a first input of a comparator; and
    a feedback loop electrically connected between an output of the comparator and a second input of the comparator.

2. The image sensing system of claim 1, wherein the feedback loop comprises:
    a digital accumulator to receive the output of the comparator; and a digital-to-analog converter electrically connected between the digital accumulator and the second input of the comparator.

3. The image sensing system of claim 2, further comprising a dither signal generator to add an analog dither signal to an output of the digital-to-analog converter.

4. The image sensing system of claim 2, further comprising a dither signal generator to add a digital dither signal to an output of the digital accumulator.

5. The image sensing system of claim 2, further comprising a multiplexer having a first input, a second input, and an output, the first input being electrically connected to the output of the comparator, the second input being electrically connected to the output of a dither signal generator, and the output of the multiplexer being electrically connected to the input of the digital accumulator.

6. The system of claim 2, wherein the digital accumulator is set to a predetermined value to provide an initial threshold to the comparator.

7. The image sensing system of claim 1, further comprising a decimation filter electrically connected to the output of the comparator.

8. The image sensing system of claim 7, wherein an output of the decimation filter corresponds to an amount of light detected by the photosensitive element over an integration period.

9. The image sensing system of claim 1, wherein the photosensitive element comprises two or more photosensitive elements.

10. The image sensing system of claim 9, further comprising a multiplexer, wherein the two or more photosensitive elements are electrically connected to two or more corresponding inputs of the multiplexer, and an output of the multiplexer is electrically connected to the first input of the comparator.

11. The image sensing system of claim 1, wherein the comparator comprises a single bit comparator or a multibit comparator.

12. A method comprising:
comparing a first input signal with a second input signal to produce a current state of an output signal, the first input signal corresponding to an amount of light detected by a sensor, and the second input signal corresponding to an aggregated value of one or more previous states of the output signal.

13. The method of claim 12, wherein the comparing comprises:
aggregating the one or more previous states of an output signal in a digital accumulator to produce a digital signal; and
converting the digital signal to produce an analog signal that corresponds to the second input signal.

14. The method of claim 12, further comprising adding an analog dither signal to the second input signal.

15. The method of claim 12, further comprising adding a digital dither signal to the digital signal.

16. The method of claim 12, further comprising multiplexing the one or more previous states of the output signal with a dither signal.

17. The method of claim 12, further comprising communicating the current state of the output signal through a decimation filter to generate a second output signal representing an amount of light detected by the sensor over an integration period.

18. The method of claim 12, wherein the sensor comprises two or more sensors that provide a multiplexed input to a comparator.

19. The method of claim 12, wherein the first input signal and the second input signal are compared in either a single bit comparator or a multibit comparator.

20. The method of claim 12, wherein comparing the first input signal and the second input signal comprises comparing the first input signal with a variable threshold associated with the second input signal.

21. One or more computer storage devices comprising instructions that, when executed by one or more processing devices, cause the one or more processing devices to:
compare a first input signal with a second input signal to produce a current state of an output signal, the first input signal corresponding to an amount of light detected by a sensor, and the second input signal corresponding to an aggregated value of one or more previous states of the output signal.

22. The one or more computer storage devices of claim 21, further comprising instructions that, when executed by the one or more processing devices, cause the one or more processing devices to perform operations comprising:
adding an analog dither signal to the second input signal.

23. The one or more computer storage devices of claim 21, further comprising instructions that, when executed by the one or more processing devices, cause the one or more processing devices to perform operations comprising:
adding a digital dither signal to the digital signal.

24. The one or more computer storage devices of claim 21, further comprising instructions that, when executed by the one or more processing devices, cause the one or more processing devices to perform operations comprising:
multiplexing the one or more previous states of the output signal with a dither signal.

25. The one or more computer storage devices of claim 21, further comprising instructions that, when executed by the one or more processing devices, cause the one or more processing devices to perform operations comprising:
communicating the current state of the output signal through a decimation filter to generate a second output signal representing an amount of light detected by the sensor over an integration period.

26. The one or more computer storage devices of claim 21, wherein the sensor comprises two or more sensors that provide a multiplexed input to a comparator.

27. The one or more computer storage devices of claim 21, wherein the first input signal and the second input signal are compared in either a single bit comparator or a multibit comparator.

28. The one or more computer storage devices of claim 21, wherein comparing the first input signal and the second input signal comprises comparing the first input signal with a variable threshold associated with the second input signal.

* * * * *